United States Patent [19]
Tada et al.

[11] Patent Number: 6,114,497
[45] Date of Patent: Sep. 5, 2000

[54] POLYBENZOXAZOLE RESIN AND PRECURSOR THEREOF

[75] Inventors: Masahiro Tada, Fujisawa; Mitsumoto Murayama, Yokohama; Takuya Hatao, Kawasaki; Takashi Yamaji, Fujieda, all of Japan

[73] Assignee: Sumitomo Bakelite Company Limited, Tokyo, Japan

[21] Appl. No.: 09/427,024

[22] Filed: Oct. 26, 1999

[30] Foreign Application Priority Data

Oct. 28, 1998 [JP] Japan .................................. 10-306727

[51] Int. Cl.[7] ..................................................... C08G 73/24
[52] U.S. Cl. ........................ 528/401; 528/176; 528/177; 528/271; 528/332; 528/397; 528/422
[58] Field of Search ..................................... 528/401, 176, 528/177, 271, 332, 397, 422

[56] References Cited

U.S. PATENT DOCUMENTS 5,145,999  9/1992  Auman et al. ......................... 564/442

FOREIGN PATENT DOCUMENTS

| 0264678 | 4/1988 | European Pat. Off. . |
| 0459395 | 12/1991 | European Pat. Off. . |
| 2595362 | 9/1987 | France . |
| 62-207332 | 9/1987 | Japan . |
| 63-318 | 1/1988 | Japan . |

Primary Examiner—Duc Truong
Attorney, Agent, or Firm—Smith, Gambrell & Russell, LLP

[57] ABSTRACT

Polybenzoxazole precursors are used to prepare resins with good electrical characteristics and thermal characteristics as well as low water absorption.

6 Claims, No Drawings

POLYBENZOXAZOLE RESIN AND PRECURSOR THEREOF

TECHNICAL FIELD

The present invention relates to polybenzoxazole resins which are excellent in electrical characteristics, thermal characteristics, mechanical characteristics, and physical characteristics, and which are usable as layer insulation films and protective films for semiconductors, layer insulation films of multilayer circuits, cover coats of flexible copper-clad sheets, solder resist films, liquid crystal-aligned films, etc.

BACKGROUND ART

Various materials such as inorganic materials and organic materials are used as semiconductor materials for various parts in accordance with characteristics required. For example, inorganic insulation films such as those of silicon dioxide which are prepared by chemical gas phase deposition process, are used as layer insulation films for semiconductors. However, with recent enhancement in function and increase in performance of semiconductors, application of inorganic insulation films of silicon dioxide and the like becomes difficult due to problems such as high dielectric constant, brittleness and high water absorption rate. As one means for improving these problems, application of organic materials is being investigated.

As organic materials for semiconductors, mention may be made of polyimide resins which are superior in heat resistance, mechanical characteristics and the like, and they are used for solder resists, cover layers, liquid crystal-aligned films, and the like. However, polyimide resins generally have problems in electrical characteristics and water absorption since they have two carbonyl groups in imide ring. For the solution of these problems, it is attempted to improve electrical characteristics, water absorption and heat resistance by introducing fluorine and trifluoromethyl group into polymer molecules, but the improvement has not yet reached the desired level.

Under the circumstances, it is attempted to apply polybenzoxazole resins which are superior to polyimide resins in electrical characteristics and water absorption, to insulation materials to be used for semiconductors. It is easy for polybenzoxazole resins to satisfy only one of electrical characteristics, thermal characteristics or physical characteristics. For example, a polybenzoxazole resin made from 4,4'-diamino-3,3'-dihydroxybiphenyl and terephthalic acid has much superior heat resistance such as high heat decomposition resistance or high Tg, but is not so good in electrical characteristics such as dielectric constant and dielectric loss tangent. A polybenzoxazole resin made from 2,2'-bis(3-amino-4-hydroxyphenyl)hexafluoropropane and terephthalic acid shows good electrical characteristics such as low dielectric constant, but is not so good in heat resistance and the like. Thus, at present, there have been obtained no resins which are excellent in all of electrical characteristics, thermal characteristics and physical characteristics.

DISCLOSURE OF THE INVENTION

The object of the present invention is to provide heat resistant resins excellent in all of electrical characteristics, thermal characteristics and low water absorption.

As a result of intensive research conducted in an attempt to solve the above problems, the inventors have found polybenzoxazole precursors represented by the following general formulas (1), (3) and (5) and polybenzoxazole resins represented by the following general formulas (2), (4) and (6), and have accomplished the present invention.

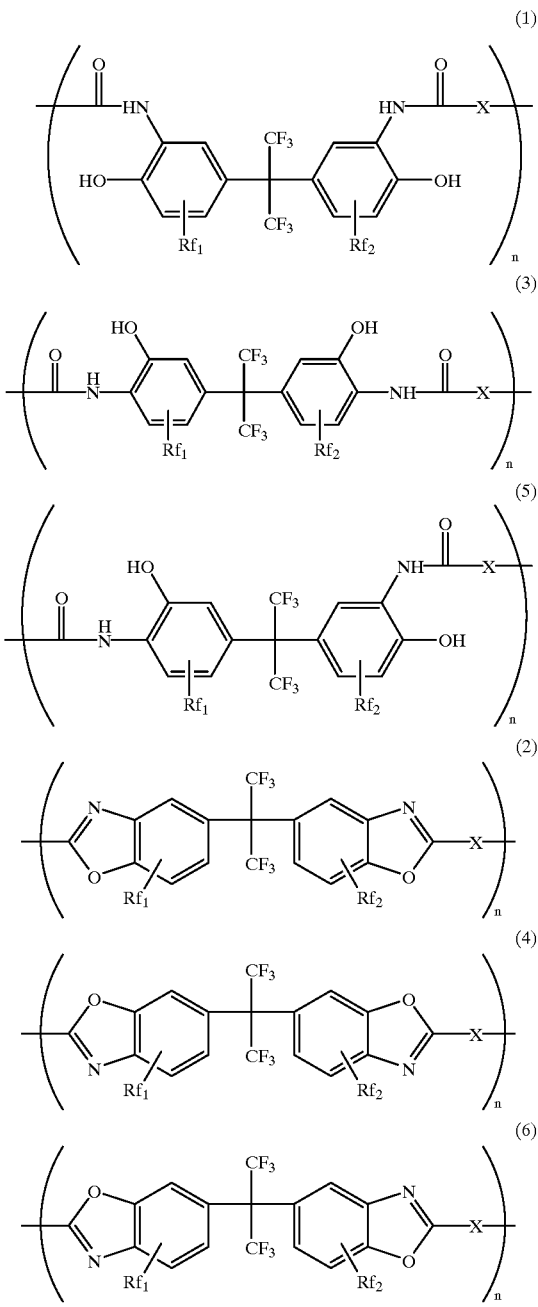

The polybenzoxazole resins represented by the formula (2) are obtained from the polybenzoxazole precursors represented by the formula (1), the resins represented by the formula (4) are obtained from the precursors represented by the formula (3), and the resins represented by the formula (6) are obtained from the precursors represented by the formula (5).

In the above formulas (1), (3) and (5) and the formulas (2), (4) and (6), n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

DETAILED DESCRIPTION OF THE INVENTION

Bisaminophenol compounds used for preparation of the polybenzoxazole precursors and resins of the present invention are represented by the following general formula (7), and as examples thereof, mention may be made of 2,2'-bis(3-amino-4-hydroxy-5-trifluoromethylphenyl)hexafluoropropane, 2,2'-bis(3-amino-4-hydroxy-6-trifluoromethylphenyl)hexafluoropropane, 2,2'-bis(3-amino-4-hydroxy-2-trifluoromethylphenyl)hexafluoropropane, 2,2'-bis(4-amino-3-hydroxy-5-trifluoromethylphenyl)hexafluoropropane, 2,2'-bis(4-amino-3-hydroxy-6-trifluoromethylphenyl)hexafluoropropane, 2,2'-bis(4-amino-3-hydroxy-2-trifluoromethylphenyl)hexafluoropropane, 2,2'-bis(3-amino-4-hydroxy-5-pentafluoroethylphenyl)hexafluoropropane, 2-(3-amino-4-hydroxy-5-trifluoromethylphenyl)-2'-(3-amino-4-hydroxy-5-pentafluoroethylphenyl)hexafluoropropane, 2-(3-amino-4-hydroxy-5-trifluoromethylphenyl)-2'-(3-hydroxy-4-amino-5-trifluoromethylphenyl)hexafluoropropane, 2-(3-amino-4-hydroxy-5-trifluoromethylphenyl)-2'-(3-hydroxy-4-amino-6-trifluoromethylphenyl)hexafluoropropane, 2-(3-amino-4-hydroxy-5-trifluoromethylphenyl)-2'-(3-hydroxy-4-amino-2-trifluoromethylphenyl)hexafluoropropane, 2-(3-amino-4-hydroxy-2-trifluoromethylphenyl)-2'-(3-hydroxy-4-amino-5-trifluoromethylphenyl)hexafluoropropane, and 2-(3-amino-4-hydroxy-6-trifluoromethylphenyl)-2'-(3-hydroxy-4-amino-5-trifluoromethylphenyl)hexafluoropropane. These bisaminophenol compounds can be used each alone or in combination of two or more. Furthermore, bisaminophenol compounds which are not represented by the general formula (7), such as 4,4'-diamino-3,3'-dihydroxybiphenyl and 2,2'-bis(3-amino-4-hydroxyphenyl)hexafluoropropane, can also be used together as far as they do not damage the performances.

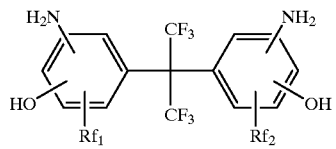

(7)

In the above formula (7), $Rf_1$ and $Rf_2$ which may be the same or different, denote H or $C_mF_{2m+1}$, with the proviso that at least one of them is $C_mF_{2m+1}$, denotes an integer of 1–10, and the amino group and the hydroxyl group are in the ortho position.

The value m is 10 or less, preferably 3 or less. If m is greater than 10, dielectric constant is low, but heat resistance and mechanical characteristics are adversely affected.

The dicarboxylic acids used for preparation of the polybenzoxazole precursors and resins of the present invention are represented by the undermentioned general formula (8), and examples thereof are 3-fluoroisophthalic acid, 2-fluoroisophthalic acid, 3-fluorophthalic acid, 2-fluorophthalic acid, 2-fluoroterephthalic acid, 2,4,5,6-tetrafluoroisophthalic acid, 3,4,5,6-tetrafluorophthalic acid, 4,4'-hexafluoroisopropylidenediphenyl-1,1'-dicarboxylic acid, perfluorosuberic acid, 2,2'-bis-(trifluoromethyl)-4,4'-biphenylenedicarboxylic acid, 3,3'-bis(trifluoromethyl)-4,4'-biphenylenedicarboxylic acid, 2,2'-bis(trifluoromethyl)-5,5'-biphenylenedicarboxylic acid, 3,3'-bis(trifluoromethyl)-5,5'-biphenylenedicarboxylic acid, 4,4'-bis(trifluoromethyl)-5,5'-biphenylenedicarboxylic acid, 4,4'-biphenyldicarboxylic acid, 2,2'-biphenyldicarboxylic acid, naphthalene-1,4-dicarboxylic acid, naphthalene-1,5-dicarboxylic acid, naphthalene-1,6-dicarboxylic acid, naphthalene-2,6-dicarboxylic acid, bis(4-carboxyphenyl)sulfone, bis(3-carboxypheny)sulfone, terephthalic acid, isophthalic acid, and 4,4'-oxydiphenyl-1,1'-dicarboxylic acid. The dicarboxylic acids are not limited to these examples. They may be used each alone or in combination of two or more.

$$HO_2C-X-CO_2H \qquad (8)$$

In the formula (8), X denotes a divalent organic group.

Methods for producing the polybenzoxazole precursor of the present invention include, for example, the condensation reaction method comprising condensation reaction of a bisaminophenol compound represented by the above general formula (7) with a dicarboxylic acid represented by the above general formula (8) in the presence of a dehydration condensation agent such as polyphosphoric acid or dicyclohexycarbodiimide, the acid chloride method comprising dehydrochlorination condensation reaction of a bisaminophenol compound represented by the general formula (7) with an acid chloride of a dicarboxylic acid represented by the general formula (8), the active ester method, and the like.

According to one example of preparation of the polybenzoxazole precursors by the acid chloride method, first, 4,4'-hexafluoroisopropylidenediphenyl-1,1'-dicarboxylic acid which is a dicarboxylic acid, is reacted with an excess amount of thionyl chloride at a temperature of from room temperature to 75° C. in the presence of a catalyst such as N,N-dimethylformamide, followed by distilling off excess thionyl chloride by heating under reduced pressure. Then, the residue is recrystallized by use of a solvent such as hexane to obtain 4,4'-hexafluoroisopropylidenediphenyl-1,1'-dicarboxylic acid chloride which is an acid chloride. Thereafter, the resulting 4,4'-hexafluoroisopropylidenediphenyl-1,1'-dicarboxylic acid chloride and 2,2'-bis(3-amino-4-hydroxy-5-trifluoromethylphenyl)hexafluoropropane which is a bisaminophenol compound, are dissolved usually in a polar solvent such as N-methyl-2-pyrrolidone, followed by carrying out the reaction at a temperature of –30° C. to room temperature in the presence of an acid-acceptor such as pyridine. Thus, the polybenzoxazole precursor can be obtained.

The polybenzoxazole resins of the present invention represented by the above general formulas (2), (4) and (6) can be obtained by subjecting the resulting polybenzoxazole precursors represented by the above general formulas (1), (3) and (5) to condensation reaction by heating or treating with a dehydrating agent in the conventional manner. If necessary, various additives such as surface active agents and coupling agents are added to the resulting resins, and these can be used as layer insulation films and protective films for semiconductors, layer insulation films of multilayer circuits, cover coats of flexible copper-clad sheets, solder resist films, liquid crystal-aligned films, etc.

Furthermore, the precursors of the polybenzoxazole resins in the present invention can be used together with naphthoquinonediazide compounds as photosensitive agents to provide photosensitive resin compositions.

The polybenzoxazole precursor of the present invention is preferably used in the state of varnish by dissolving it in a solvent. Examples of the solvent are N-methyl-2-pyrrolidone, γ-butyrolactone, N,N-dimethylacetamide, N,N-dimethylformamide, dimethyl sulfoxide, diethyl ether, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate, methyl ethyl ketone, and methyl isobutyl ketone. These can be used each alone or in admixture of two or more.

The polybenzoxazole precursor of the present invention can be used in the following manner. The precursor is dissolved in the above solvent, and the solution is coated on a suitable support such as glass, metal, silicon wafer and ceramic substrate. As the coating method, mention may be made of spin coating with a spinner, spray coating with a spray coater, dipping, printing, roll coating, etc. After formation of a coating film in this way, the film is preferably heat-treated to convert it into a polybenzoxazole resin.

BEST MODE FOR CARRYING OUT THE INVENTION

The present invention will be explained in more detail by way of the following examples. It should be understood that they are exemplary only, and should not be construed as limiting the present invention in any manner.

EXAMPLE 1

(1) Trifluoromethylation of Bisaminophenol Compound

150 Grams of 2,2'-bis(3-amino-4-hydroxyphenyl) hexafluoropropane (manufactured by Central Glass Co., Ltd.) was dissolved in 890 ml of dried N,N-dimethylformamide (manufactured by Kishida Chemical Co., Ltd., hereinafter referred to as "DMF"), and to the solution was added 393 g of S-(trifluoromethyl) dibenzothiophenium trifluoromethanesulfonate (manufactured by Daikin Kaseihin Hanbai Co., Ltd.) under cooling with ice. Then, the solution was heated to 70° C. at a heating rate of 10° C./hour, followed by carrying out the reaction at 70° C. for 24 hours. The reaction was carried out in nitrogen atmosphere. The reaction mixture was added to water, and the aqueous layer was adjusted to around neutral, followed by extraction with diethyl ether (manufactured by Kishida Chemical Co., Ltd., hereinafter referred to as "ether"). The ether layer was collected and ether was distilled off. Then, the precipitate was sufficiently washed with an organic solvent such as ethyl acetate to obtain 100.5 g of 2,2'-bis(3-amino-4-hydroxy-5-trifluoromethylphenyl) hexafluoropropane.

(2) Preparation of Acid Chloride

92 Grams of 4,4'-hexafluoroisopropylidenediphenyl-1,1'-dicarboxylic acid (manufactured by Clariant Japan Co., Ltd.), 166 ml of thionyl chloride (manufactured by Kishida Chemical Co., Ltd.) and 1.8 ml of dried DMF were charged in a reaction vessel, and the reaction was carried out at 60° C. for 2 hours. After completion of the reaction, the excess thionyl chloride was distilled off by heating under reduced pressure. The precipitate was recrystallized using hexane (manufactured by Kanto Chemical Co., Ltd.) to obtain 84.6 g of 4,4'-hexafluoroisopropylidenediphenyl-1,1'-dicarboxylic acid chloride.

(3) Preparation of Precursor and Production of Resin Film 100.5 Grams (0.2 mol) of 2,2'-bis(3-amino-4-hydroxy-5-trifluoromethylphenyl)hexafluoropropane was dissolved in 400 g of dried dimethylacetamide, and 39.6 g (0.5 mol) of pyridine (manufactured by Kishida Chemical Co., Ltd.) was added to the solution, followed by adding dropwise thereto a solution of 84.6 g (0.2 mol) of 4,4'-hexafluoroisopropylidenediphenyl-1,1'-dicarboxylic acid chloride in 200 g of dimethylacetamide at −15° C. in dry nitrogen over a period of 30 minutes. After completion of the addition, the temperature was restored to room temperature, followed by stirring at room temperature for 5 hours. Then, the reaction mixture was added dropwise to 700 ml of distilled water, and the precipitate was collected and dried to obtain a polybenzoxazole precursor.

The resulting polybenzoxazole precursor was dissolved in N-methyl-2-pyrrolidone, and the solution was filtered by a Teflon filter of 0.2 μm in pore diameter to obtain a varnish.

The polybenzoxazole precursor obtained above had a number-average molecular weight (Mn) of 25000 calculated in terms of polystyrene using GPC manufactured by Toso Co., Ltd.

The varnish was coated on a glass sheet by a doctor blade having a gap of 300 μm. Then, this was dried at 70° C. for 1 hour in an oven, and the coating was peeled off to obtain a polybenzoxazole precursor film of 20 μm in thickness. This film was fixed by a metal frame and heated at 150° C. for 30 minutes, 250° C. for 30 minutes and 350° C. for 30 minutes successively in this order under nitrogen atmosphere to obtain a polybenzoxazole resin. This resin film was evaluated on various characteristics and the results are shown in Table 1.

EXAMPLE 2

68.3 Grams of 1,2,3,5-tetrafluoro-4,6-dicyanobenzene (manufactured by SDS Bioteck Co., Ltd.) was added to 342 g of 65% aqueous sulfuric acid. The former was dissolved by heating, and then the solution was heated for 3 hours under refluxing conditions. The precipitated crystal was subjected to suction filtration, and the collected crystal was washed with concentrated hydrochloric acid (manufactured by Wako Jun-yaku Industry Co., Ltd.) and then air-dried to obtain 49.2 g of 2,4,5,6-tetrafluoroisophthalic acid.

A polybenzoxazole resin was prepared in the same manner as in Example 1, except that 54.2 g (0.2 mol) of 2,4,5,6-tetrafluoroisophthalic acid chloride obtained from 2,4,5,6-tetrafluoroisophthalic acid by the same method for preparation of acid chloride as in Example 1 was used in place of 84.6 g (0.2 mol) of 4,4'-hexafluoroisopropylidenediphenyl-1,1'-dicarboxylic acid chloride of Example 1. The resulting resin was evaluated similarly to Example 1.

EXAMPLE 3

A polybenzoxazole resin was prepared in the same manner as in Example 1, except that 59.0 g (0.2 mol) of 4,4'-oxydiphenyl-1,1'-dicarboxylic acid chloride obtained from 4,4'-oxydiphenyl-1,1'-dicarboxylic acid by the same method for preparation of acid chloride as in Example 1 was used in place of 84.6 g (0.2 mol) of 4,4'-hexafluoroisopropylidenediphenyl-1,1'-dicarboxylic acid chloride of Example 1. The resulting resin was evaluated similarly to Example 1.

EXAMPLE 4

A polybenzoxazole resin was prepared in the same manner as in Example 1, except that 42.3 g (0.1 mol) of 4,4'-hexafluoroisopropylidenediphenyl-1,1'-dicarboxylic acid chloride and 29.5 g (0.1 mol) of 4,4'-oxydiphenyl-1,1'-dicarboxylic acid chloride were used in place of 84.6 g (0.2 mol) of 4,4'-hexafluoroisopropylidenediphenyl-1,1'-dicarboxylic acid chloride of Example 1. The resulting resin was evaluated similarly to Example 1.

EXAMPLE 5

A polybenzoxazole resin was prepared in the same manner as in Example 1, except that 42.3 g (0.1 mol) of 4,4'-hexafluoroisopropylidenediphenyl-1,1'-dicarboxylic acid chloride and 27.1 g (0.1 mol) of 2,4,5,6-tetrafluoroisophthalic acid chloride were used in place of 84.6 g (0.2 mol) of 4,4'-hexafluoroisopropylidenediphenyl-1,1'-dicarboxylic acid chloride of Example 1. The resulting resin was evaluated similarly to Example 1.

EXAMPLE 6

A polybenzoxazole resin was prepared in the same manner as in Example 1, except that 70.4 g (0.14 mol) of 2,2'-bis(3-amino-4-hydroxy-5-trifluoromethylphenyl)hexafluoropropane and 13.0 g (0.06 mol) of 4,4'-diamino-3,3'-dihydroxybiphenyl were used in place of 100.5 g (0.2 mol) of 2,2'-bis(3-amino-4-hydroxy-5-trifluoromethylphenyl)hexafluoropropane of Example 1. The resulting resin was evaluated similarly to Example 1.

EXAMPLE 7

A polybenzoxazole resin was prepared in the same manner as in Example 1, except that 50.3 g (0.1 mol) of 2,2'-bis(3-amino-4-hydroxy-5-trifluoromethylphenyl)hexafluoropropane and 21.6 g (0.1 mol) of 4,4'-diamino-3,3'-dihydroxybiphenyl were used in place of 100.5 g (0.2 mol) of 2,2'-bis(3-amino-4-hydroxy-5-trifluoromethylphenyl)hexafluoropropane of Example 1. The resulting resin was evaluated similarly to Example 1.

EXAMPLE 8

A polybenzoxazole resin was prepared in the same manner as in Example 1, except that 119.7 g (0.2 mol) of 2,2'-bis(3-amino-4-hydroxy-5-pentafluoroethylphenyl)hexafluoropropane was used in place of 100.5 g (0.2 mol) of 2,2'-bis(3-amino-4-hydroxy-5-trifluoromethylphenyl)hexafluoropropane of Example 1. The resulting resin was evaluated similarly to Example 1.

COMPARATIVE EXAMPLE 1

A polybenzoxazole resin was prepared in the same manner as in Example 1, except that 43.2 g (0.2 mol) of 4,4'-diamino-3,3'-dihydroxybiphenyl was used in place of 100.5 g (0.2 mol) of 2,2'-bis(3-amino-4-hydroxy-5-trifluoromethylphenyl)hexafluoropropane of Example 1 and that 59.0 g (0.2 mol) of 4,4'-oxydiphenyl-1,1'-dicarboxylic acid chloride was used in place of 84.6 g (0.2 mol) of 4,4'-hexafluoroisopropylidenediphenyl-1,1'-dicarboxylic acid chloride of Example 1. The resulting resin was evaluated similarly to Example 1.

COMPARATIVE EXAMPLE 2

A polybenzoxazole resin was prepared in the same manner as in Example 1, except that 43.2 g (0.2 mol) of 4,4'-diamino-3,3'-dihydroxybiphenyl was used in place of 100.5 g (0.2 mol) of 2,2'-bis(3-amino-4-hydroxy-5-trifluoromethylphenyl)hexafluoropropane of Example 1. The resulting resin was evaluated similarly to Example 1.

COMPARATIVE EXAMPLE 3

A polybenzoxazole resin was prepared in the same manner as in Example 1, except that 43.3 g (0.2 mol) of 2,2'-bis(3-amino-4-hydroxyphenyl)hexafluoropropane was used in place of 100.5 g (0.2 mol) of 2,2'-bis(3-amino-4-hydroxy-5-trifluoromethylphenyl)hexafluoropropane of Example 1 and that 59.0 g (0.2 mol) of 4,4'-oxydiphenyl-1,1'-dicarboxylic acid chloride was used in place of 84.6 g (0.2 mol) of 4,4'-hexafluoroisopropylidenediphenyl-1,1'-dicarboxylic acid chloride of Example 1. The resulting resin was evaluated similarly to Example 1.

COMPARATIVE EXAMPLE 4

66.9 Grams (0.2 mol) of 2,2'-bis(4-aminophenyl)hexafluoropropane (manufactured by Central Glass Co., Ltd.) was dissolved in 400 g of dried N-methyl-2-pyrrolidone, followed by adding dropwise thereto a solution of 88.8 g of hexafluoroisopropylidene-2,2'-bisphthalic acid anhydride (manufactured by Daikin Kogyo Co., Ltd.) in 200 g of N-methyl-2-pyrrolidone, at 10° C. in dry nitrogen over a period of 30 minutes. After completion of the addition, the temperature was restored to room temperature, followed by stirring at room temperature for 2 hours. Then, the reaction mixture was added dropwise to 1000 ml of distilled water, and the precipitate was collected and dried to obtain a polyimide precursor.

The resulting polyimide precursor was dissolved in N-methyl-2-pyrrolidone, and a polyimide resin was prepared and evaluated similarly to Example 1.

COMPARATIVE EXAMPLE 5

A polybenzoxazole resin was prepared in the same manner as in Example 1, except that 150.2 g (0.2 mol) of 2,2'-bis(3-amino-4-hydroxy-5-perfluoroundecaphenyl)hexafluoropropane was used in place of 100.5 g (0.2 mol) of 2,2'-bis(3-amino-4-hydroxy-5-trifluoromethylphenyl)hexafluoropropane of Example 1. The resulting resin was evaluated similarly to Example 1.

The results of evaluation in the Examples and the Comparative Examples are shown in Table 1.

TABLE 1

|  | Dielectric constant | Heat resistance (° C.) | Water absorption (%) |
|---|---|---|---|
| Example 1 | 2.3 | 510 | 0.1 |
| Example 2 | 2.2 | 513 | 0.1 |
| Example 3 | 2.4 | 502 | 0.1 |
| Example 4 | 2.4 | 505 | 0.1 |
| Example 5 | 2.4 | 511 | 0.1 |
| Example 6 | 2.4 | 518 | 0.1 |
| Example 7 | 2.4 | 520 | 0.1 |
| Example 8 | 2.2 | 501 | 0.1 |
| Comparative Example 1 | 3.2 | 525 | 0.3 |
| Comparative Example 2 | 3.0 | 510 | 0.3 |
| Comparative Example 3 | 3.0 | 503 | 0.3 |
| Comparative Example 4 | 2.7 | 498 | 1.1 |
| Comparative Example 5 | 2.2 | 420 | 0.1 |

Dielectric constant: This was measured at a frequency of 1 MHz by use of HP-4284A Precision LCR meter made by Hewlett-Packard Co. in accordance with JIS-K6911.

Heat resistance: Temperature at which the weight reduces by 5%, was measured at a heating rate of 10° C./min. in nitrogen gas flow by use of TG/DTA 220 meter made by Seiko Denshi Kogyo K.K.

Water absorption: Water absorption at a temperature of 85° C. and a humidity of 85% for 24 hours was measured by the weight method.

As clear from Table 1, the polybenzoxazole resins of Examples 1–8 showed good results on dielectric constant, heat resistance and water absorption. However, the polybenzoxazole resins of Comparative Examples 1–3 were higher in dielectric constant than those of the Examples, the polyimide resin of Comparative Example 4 was much inferior to those of the Examples in water absorption, and the polybenzoxazole resin of Comparative Example 5 was lower in heat resistance than those of the Examples. Thus, it can be seen that polybenzoxazole resins and polyimide resins having no structures of the present invention cannot satisfy all of dielectric constant, heat resistance and water absorption.

From the above Examples, it is clear that polybenzoxazole resins excellent in all of electrical characteristics, thermal characteristics and low water absorption can be obtained by the present invention.

Therefore, the polybenzoxazole resins of the present invention can be applied to various uses which require electrical characteristics, thermal characteristics, mechanical characteristics, and physical characteristics, and can be used, for example, as layer insulation films and protective films for semiconductors, layer insulation films of multilayer circuits, cover coats of flexible copper-clad sheets, solder resist films, liquid crystal-aligned films, etc.

What is claimed is:

1. A polybenzoxazole precursor having recurring units represented by the following general formula (1):

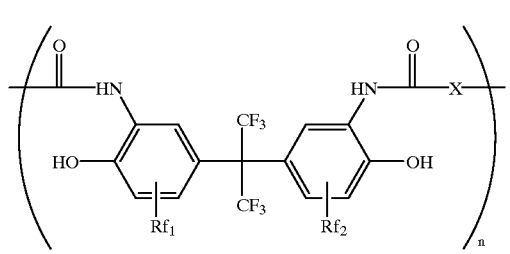

(1)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

2. A polybenzoxazole resin having recurring units represented by the following general formula (2):

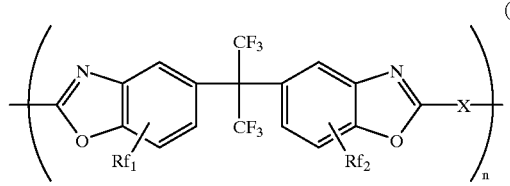

(2)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

3. A polybenzoxazole precursor having recurring units represented by the following general formula (3):

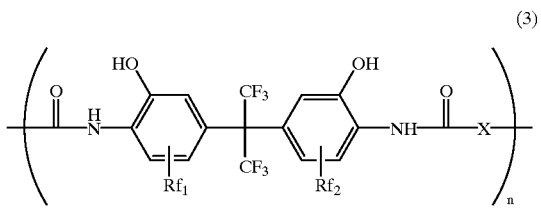

(3)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

4. A polybenzoxazole resin having recurring units represented by the following general formula (4):

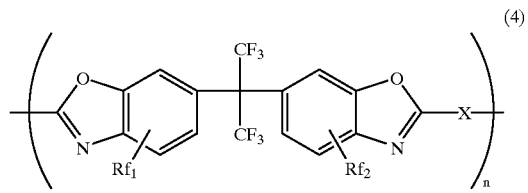

(4)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

5. A polybenzoxazole precursor having recurring units represented by the following general formula (5):

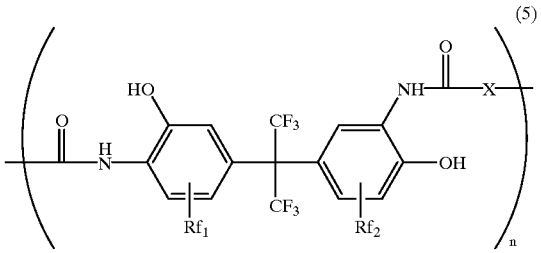

(5)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

6. A polybenzoxazole resin having recurring units represented by the following general formula (6):

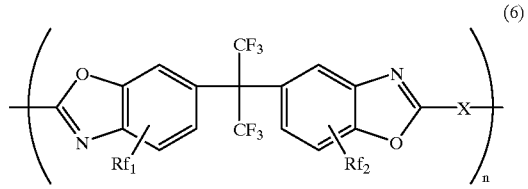

(6)

wherein n denotes an integer of 2–1000, $Rf_1$ and $Rf_2$ which may be the same or different, denote H or $C_mF_{2m+1}$, with the proviso that at least one of them is $C_mF_{2m+1}$, m denotes an integer of 1–10, and X denotes a divalent organic group.

* * * * *